(12) United States Patent
Tseng

(10) Patent No.: US 9,459,418 B2
(45) Date of Patent: Oct. 4, 2016

(54) FLIP CHIP OPTICAL COMMUNICATION APPARATUS

(71) Applicant: HON HAI PRECISION INDUSTRY CO., LTD., New Taipei (TW)

(72) Inventor: Kuo-Fong Tseng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 313 days.

(21) Appl. No.: 14/219,014

(22) Filed: Mar. 19, 2014

(65) Prior Publication Data

US 2014/0312211 A1    Oct. 23, 2014

(30) Foreign Application Priority Data

Apr. 19, 2013 (TW) .............. 102113881 A

(51) Int. Cl.
*G02B 27/00* (2006.01)
*H01J 3/14* (2006.01)
*G01J 1/04* (2006.01)
*G02B 6/42* (2006.01)

(52) U.S. Cl.
CPC ........... *G02B 6/4268* (2013.01); *G02B 6/4206* (2013.01); *G02B 6/4214* (2013.01); *G02B 6/4246* (2013.01)

(58) Field of Classification Search
CPC ...................................... H04B 1/587

USPC ........ 250/551, 239, 216, 227.11; 385/15–53; 257/666, 676

See application file for complete search history.

(56) References Cited

U.S. PATENT DOCUMENTS

| 7,923,676 | B2* | 4/2011 | Kinoshita | G03B 17/00 250/208.1 |
| 2003/0202730 | A1* | 10/2003 | Fujieda | G02B 6/12004 385/14 |
| 2009/0226130 | A1* | 9/2009 | Doany | G02B 6/4201 385/14 |

* cited by examiner

*Primary Examiner* — Pascal M Bui Pho
(74) *Attorney, Agent, or Firm* — Zhigang Ma

(57) ABSTRACT

An optical communication apparatus includes a PCB, a photoelectric unit for emitting or receiving light carrying optical signals, a calculation and control unit, and a light waveguide for transmitting optical signals. The calculation and control unit controls the photoelectric unit, processes electrical signals, calculates based on the electrical signals, and controls the photoelectric unit to emit or receive light. The light waveguide is positioned on a surface of the PCB. The calculation and control unit includes a lapping plate lapping on the surface of the PCB. The lapping plate defines an opening exposing a portion of the light waveguide. The photoelectrical unit is positioned on the lapping plate covering the opening and is optically aligned with the light waveguide through the opening.

11 Claims, 4 Drawing Sheets

FLIP CHIP OPTICAL COMMUNICATION APPARATUS

BACKGROUND

1. Technical Field

The present disclosure relates to communication apparatuses, and particularly to an optical communication apparatus.

2. Description of Related Art

An optical communication apparatus generally includes a printed circuit board (PCB), an emitter, a receiver, a light waveguide, a driver chip, a calculation chip, a control chip, and a storage element. In assembly, the emitter, the receiver, the light waveguide, the driver chip, the calculation chip, the control chip, and the storage element are positioned on the PCB. The PCB usually have a small size for minimum purpose, thus the emitter, the receiver, the light waveguide, the driver chip, the calculation chip, the control chip, and the storage element should be concentrated to share a narrow area of the PCB. However, in work, the emitter, the receiver, the driver chip, the calculation chip, the control chip, and the storage element would generate a lot of heat, and the heat cannot be efficiently dissipated out of the optical communication apparatus because of concentration of elements arranged on the PCB.

Therefore, what is needed is an optical communication apparatus addressing the limitations described.

BRIEF DESCRIPTION OF THE DRAWING

The components of the drawing are not necessarily drawn to scale, the emphasis instead being placed upon clearly illustrating the principles of the embodiments of the present disclosure.

DETAILED DESCRIPTION

Figure 1:
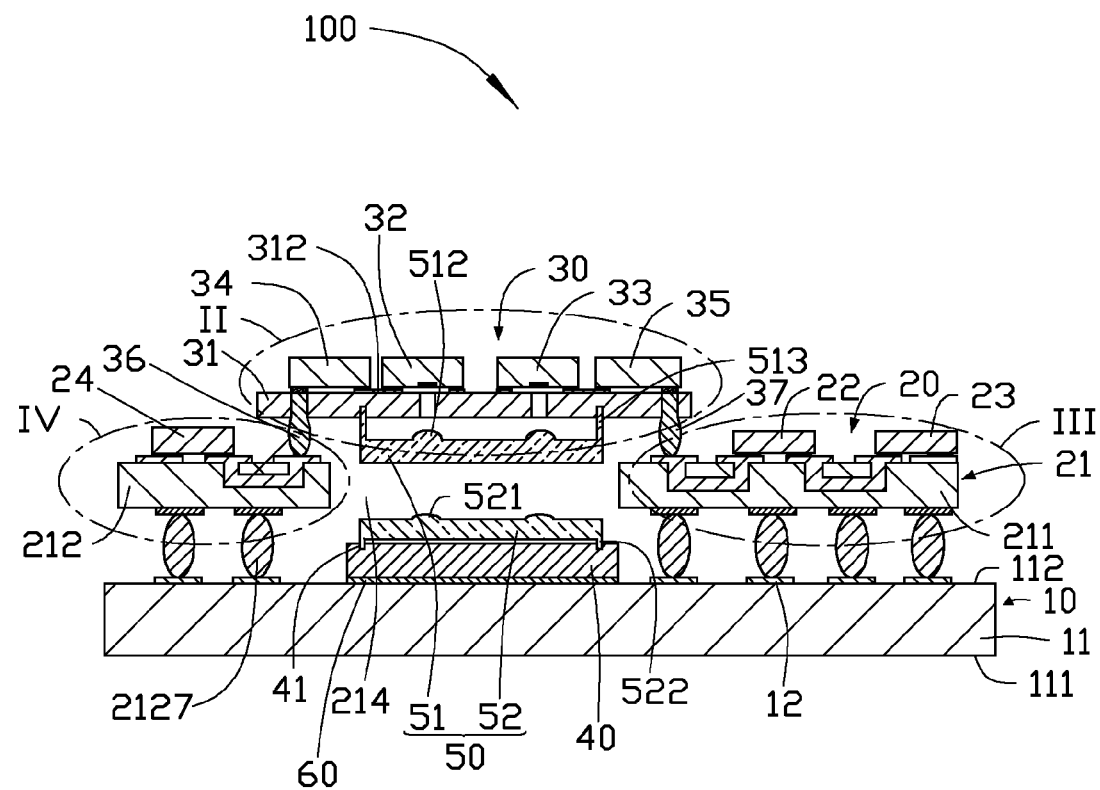
FIG. 1 is a schematic view of an optical communication apparatus, according to an exemplary embodiment of the present disclosure.
Figure 2:
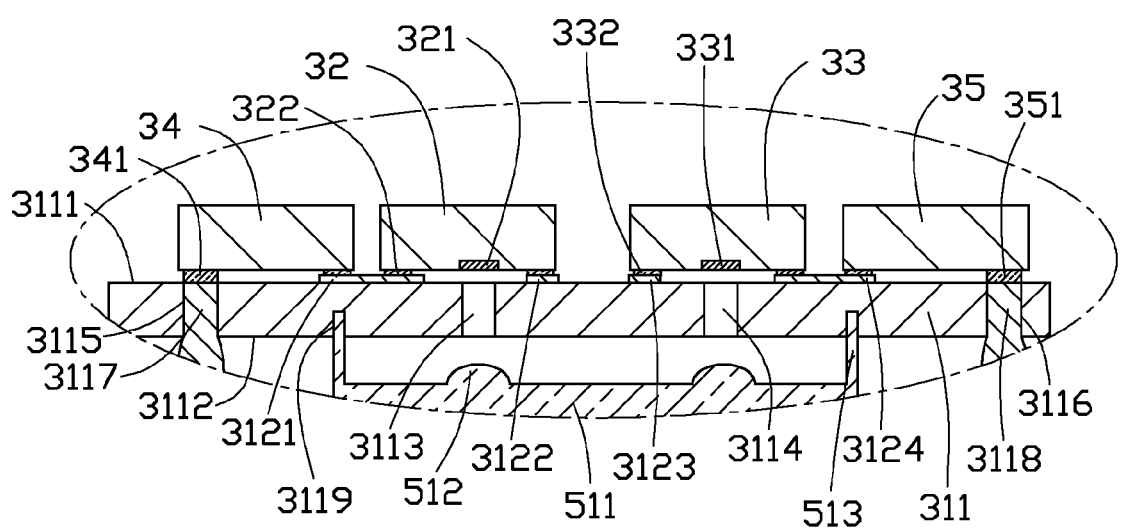
FIG. 2 is an enlarged view of a circled part II of the optical communication apparatus.
Figure 3:
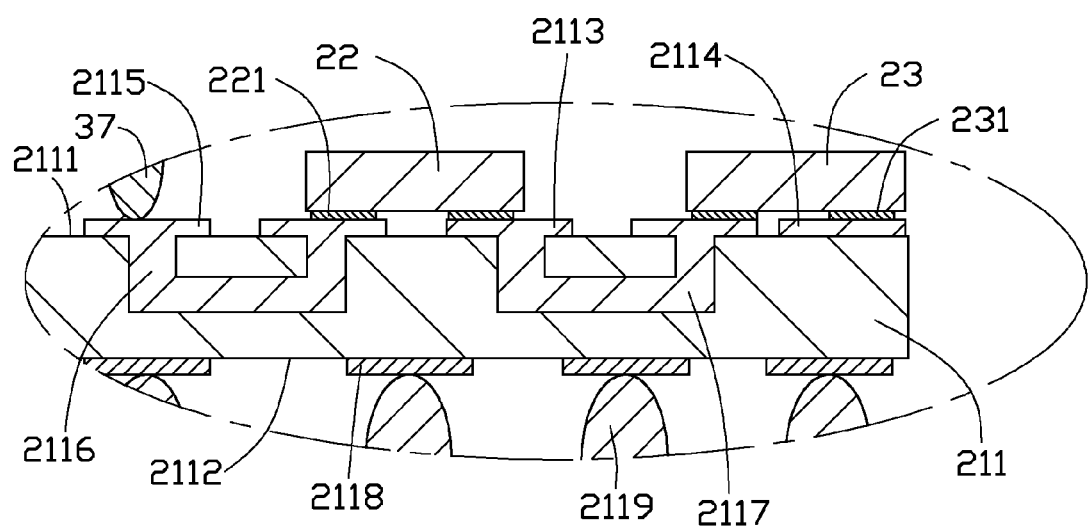
FIG. 3 is an enlarged view of a circled part III of the optical communication apparatus.
Figure 4:
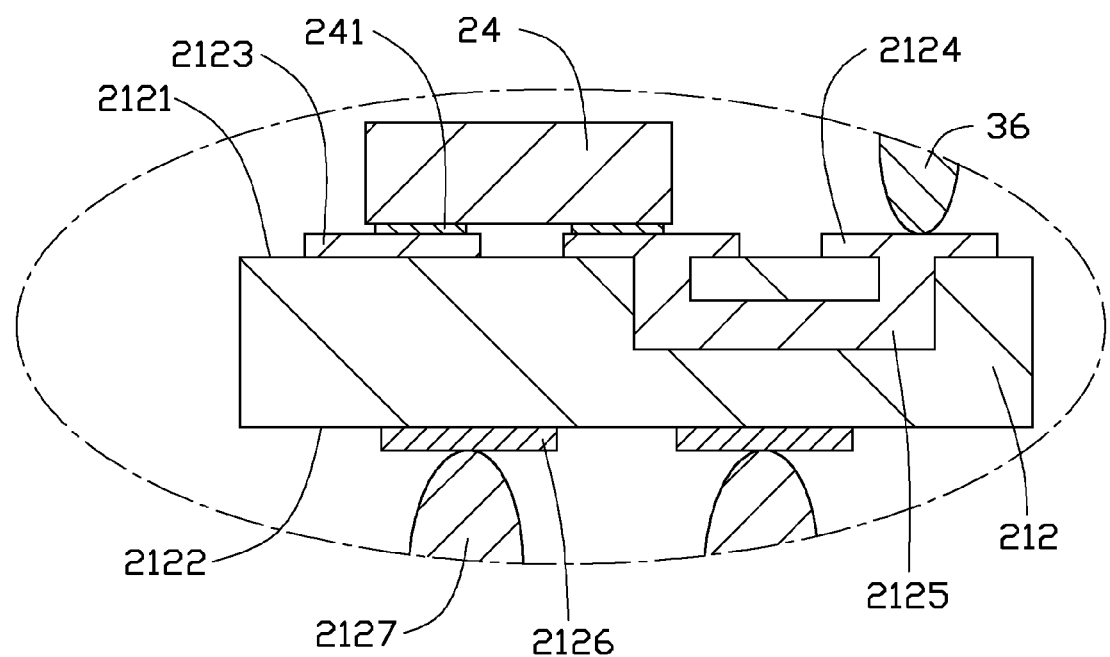
FIG. 4 is an enlarged view of a circled part IV of the optical communication apparatus.

FIGS. 1-4 show an optical communication apparatus 100, according to an exemplary embodiment of the present disclosure. The optical communication apparatus 100 includes a PCB 10, a calculation and control unit 20, a photoelectric unit 30, a light waveguide 40, and a lens unit 50.

The PCB 10 includes a substrate 11 and a number of first connecting pads 12 formed on the substrate 11. The substrate 11 includes a first surface 111 and an opposite second surface 112. The first connecting pads 12 are formed on the second surface 112. In this embodiment, the substrate 11 is made from silicon (Si).

The calculation and control unit 20 is configured for controlling optical signals (emit/receive), processing electrical signals, and calculations based on the electrical signals. The calculation and control unit 20 includes a lapping plate 21, a storage element 22, a calculation chip 23, and a control chip 24. The lapping plate 21 includes a first plate portion 211 and a second plate portion 212. The lapping plate 21 defines an opening 214 between the first plate portion 211 and the second plate portion 212.

The first plate portion 211 includes a first upper surface 2111 and an opposite first lower surface 2112. The first plate portion 211 includes two second connecting pads 2113 corresponding to the storage element 22, two third connecting pads 2114 corresponding to the calculation chip 23, and a fourth connecting pad 2115 corresponding to the photoelectric unit 30. The second connecting pads 2113, the third connecting pads 2114, and the fourth connecting pad 2115 are formed on the first upper surface 2111. The fourth connecting pad 2115 is connected to one of the second connecting pads 2113 by a first connecting portion 2116, the other of the second connecting pads 2113 is connected to one of the third connecting pads 2114 by a second connecting portion 2117. The first plate portion 211 further includes a number of fifth connecting pads 2118 formed on the first lower surface 2112. The first plate portion 211 is supported on the PCB 10 by a number of first soldering balls 2119, and each first soldering ball 2119 electrically connects a fifth connecting pad 2118 to a corresponding first connecting pad 12.

The second plate portion 212 includes a second upper surface 2121 and an opposite second lower surface 2122. The second plate portion 212 includes two sixth connecting pads 2123 corresponding to the control chip 24 and a seventh connecting pad 2124 corresponding to the photoelectric unit 30. The seventh connecting pad 2124 is connected to one of the sixth connecting pads 2123 by a third connecting portion 2125. The sixth connecting pads 2123 and the seventh connecting pads 2124 are formed on the first upper surface 2121. The second plate portion 212 further includes a number of eighth connecting pads 2126 formed on the second lower surface 2122. The second plate portion 212 is supported on the PCB 10 by a number of second soldering balls 2127, and each soldering ball 2127 electrically connects an eighth connecting pad 2126 to a corresponding first connecting pad 12.

The storage element 22 stores information of the optical communication apparatus 100. The calculation chip 24 processes electrical signals and calculates based on the electrical signals. The control chip 24 controls the photoelectric unit 30 to emit/receive light carrying optical signals. The storage element 22 and the calculation chip 24 are electrically connected to the first plate portion 211, and the control chip is electrically connected to the second plate portion 212. The storage element 22 and the calculation chip 23 are electrically connected to each other by the first plate portion 211. In detail, the storage element 22 includes two first connecting pins 221 corresponding to the second connecting pads 2113. Each first connecting pin 221 is connected to a corresponding second connecting pad 2113. The calculation chip 23 includes two second connecting pins 231 corresponding to the third connecting pads 2114. Each second connecting pin 231 is connected to a corresponding third connecting pad 2114. The control chip 24 includes two third connecting pins 241 corresponding to the sixth connecting pads 2123. Each third connecting pin 231 is connected to a corresponding sixth connecting pad 2123. In this embodiment, the first connecting pins 221, the second connecting pins 231, and the third connecting pins 241 are respectively connected to the second connecting pads 2113, the third connecting pads 2114, and the sixth connecting pads 2123 via a eutectic mixture. A material of the first connecting pins 221, the second connecting pins 231, the third connecting pins 241, the second connecting pads 2113, the third connecting pads 2114, and the sixth connecting pads 2123 can be one or more alloys of Au—Sn, Sn—Sb, Sn—Ag, Sn—Pb, In—Ag, In—Sn and Sn—Ag—Cu.

The photoelectric unit 30 converts electrical/optical signals into corresponding optical/electrical signals, thus to emit/receive optical signals. The photoelectric unit 30 includes a base plate 31, an emitter 32, a receiver 33, a first driver chip 34, and a second driver chip 35. The emitter 32, the receiver 33, the first driver chip 34, and the second driver chip 35 are electrically connected to the base plate 31. The first driver chip 34 is electrically connected to the emitter 32 by the base plate 31, and the second driver chip 35 is electrically connected to the receiver 33 by the base plate 31. The base plate 31 includes a bottom layer 311 and a conductive pattern 312 formed on a surface of the bottom layer 311. The bottom layer 311 includes a top surface 3111 and an opposite bottom surface 3112. The bottom layer 311 defines a first through hole 3113 corresponding to the emitter 32, a second through hole 3114 corresponding to the receiver 33, a third through hole 3115 corresponding to the first driver chip 34, and a fourth through hole 3116 corresponding to the second driver chip 35. The third through hole 3115 and the fourth through hole 3116 are respectively filled with a conductive material 3117, 3118. The bottom layer 311 further defines two first positioning holes 3119 in the bottom surface 3112. The conductive pattern 312 is formed on the top surface 3111. The conductive pattern 312 includes a first conductive piece 3121, a second conductive piece 3122, a third conductive piece 3123, and a fourth conductive piece 3124. The conductive pattern 312 can be formed on the top surface 3111 via a chemical vapor deposition (CVD) process or a magnetron sputtering process, in this embodiment, a material of the conductive pattern 312 is copper. The first conductive piece 3121, the second conductive piece 3122, the third conductive piece 3123, and the fourth conductive piece 3124 are formed via an etching process. The first conductive piece 3121 and the second conductive piece 3122 are positioned at two opposite sides of the first through hole 3113, and the third conductive piece 3123 and the fourth conductive piece 3124 are formed at two opposite sides of the second through hole 3114.

The emitter 32 converts electrical signals into corresponding electrical signals and emits light carrying the optical signals. The emitter 32 includes an emitting portion 321 and two fourth connecting pins 322. The emitting portion 321 and the fourth connecting pins 322 are formed on the same surface of the emitter 32. The emitter 32 is connected to the base plate 31 via a flip chip, in detail, the surface of the emitter 32 with the emitting portion 321 faces toward the base plate 31, the emitting portion 321 is aligned with the first through hole 3113, the fourth connecting pins 322 are respectively connected to the first conductive piece 3121 and the second conductive piece 3122. In this embodiment, the emitter 32 is a laser diode.

The receiver 33 receives light carrying optical signals and converts the optical signals into corresponding electrical signals. The receiver 33 includes a receiving portion 331 and two fifth connecting pins 332. The receiving portion 331 and the fifth connecting pins 332 are formed on the same surface of the emitter 32. The receiver 33 is connected to the base plate 31 via a flip chip. The surface of the receiver 33 with the receiving portion 331 faces toward the base plate 31, the receiving portion 331 is aligned with the second through hole 3114, the fifth connecting pins 332 are respectively connected to the third conductive piece 3123 and the fourth conductive piece 3124. In this embodiment, the receiver 33 is a laser diode.

The first driver chip 34 drives the emitter 32 to emit light carrying optical signals. The first driver chip 34 includes two sixth connecting pins 341, one of the sixth connecting pins 341 is connected to the first conductive piece 3121, and the other of the sixth connecting pins 341 is connected to the conductive material 3117. The first driver chip 34 is electrically connected to the emitter 32 by the first conductive piece 3121. The second driver chip 35 drives the receiver 33 to receive light carrying optical signals. The second driver chip 35 includes two seventh connecting pins 351, one of the seventh connecting pins 351 is connected to the fourth conductive piece 3124, and the other of the seventh connecting pins 351 is connected to the conductive material 3118. The second driver chip 35 is electrically connected to the receiver 33 by the fourth conductive piece 3124.

In this embodiment, the conductive pattern 312 is connected to the emitter 32, the receiver 33, the first driver chip 34, and the second driver chip 35 via a eutectic mixture.

The assembled photoelectric unit 30 is positioned on the lapping plate 21 covering the opening 214 of the lapper plate 21. The seventh connecting pad 2124 is electrically connected to the conductive material 3117 by a third soldering ball 36, and the fourth connecting pad 2115 is electrically connected to the conductive material 3118 by a fourth soldering ball 37. The third and fourth soldering balls 36, 37 support the assembled photoelectrical unit 30 on the lapping plate 21.

The light waveguide 40 is configured for transmitting optical signals. The light waveguide 40 is fixed on the second surface 112 of the substrate 11 by an adhesive 60. In this embodiment, the adhesive 60 is an ultraviolet (UV) curable adhesive. The light waveguide 40 defines two second positioning holes 41 in a surface face away from the second surface 112.

The lens unit 50 couples optical signals between the photoelectric unit 30 and the light waveguide 40. The lens unit 50 includes a first lens element 51 connected to the base plate 31 and a second lens element 52 connected to the light waveguide 40. The first lens element 51 includes a main body 511, two first converging portions 512 corresponding to the emitter 32 and the receiver 33, and two first positioning portions 513 corresponding to the first positioning holes 3119. The first positioning portions 513 are respectively engaged into the first positioning holes 3119. The first converging portions 512 are respectively aligned with the emitter 32 and the receiver 33. The second lens element 52 has a similar structure as the first lens element 52. The second lens element 52 includes two second converging portions 521 corresponding to the first converging portions 512 and two second positioning portions 522 corresponding to the second positioning holes 41. The second positioning portions 522 are respectively engaged into the second positioning holes 41. The second converging portions 521 are respectively aligned with the first converging portions 512.

The second lens element 52 or the light waveguide 40 may have a reflecting surface (not shown) for reflecting light for a predetermined angle, thus coupling optical signals between the photoelectric element 30 and the light waveguide 40.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the disclosure.

What is claimed is:

1. An optical communication apparatus, comprising:
    a PCB;
    a photoelectric unit;
    a calculation and control unit for processing electrical signals and controlling the photoelectric unit based on the processed electrical signals; and
    a light waveguide for transmitting optical signals, the light waveguide being positioned on a surface of the PCB;
    wherein the calculation and control unit comprises a lapping plate positioned on the surface of the PCB, the lapping plate defines an opening exposing a portion of the light waveguide, the photoelectric unit is positioned on the lapping plate covering the opening and is optically aligned with the light waveguide through the opening;
    wherein the PCB comprises a substrate and a plurality of first connecting pads formed on the substrate, the lapping plate is connected to the PCB by the first connecting pads;
    wherein the calculation and control unit comprises a storage element, a calculation chip, and a control chip positioned on the lapping plate, the storage element is configured for storing information of the optical communication apparatus, the calculation chip is configured for processing electrical signals and calculating based on the electrical signals, the control chip is configured for controlling the photoelectric unit;
    wherein the lapping plate comprises a first plate portion and a second plate portion, the opening is defined between the first plate portion and the second plate portion, the storage element and the calculation chip are positioned on the first plate portion and electrically connected to each other, and the control chip is electrically connected to the second plate portion; and
    wherein the first plate portion comprises two second connecting pads connected to the storage element, two third connecting pads connected to the calculation chip, a fourth connecting pad connected to the photoelectric unit, a first connecting portion connecting the fourth connecting pad to one of the second connecting pads, and a second connecting portion connecting the other of the second connecting pads to one of the third connecting pads.

2. The optical communication apparatus of claim 1, wherein the second plate portion comprises two sixth connecting pads connected to the control chip, a seventh connecting pad connected to the photoelectric unit, and a third connecting portion connecting the seventh connecting pad to one of the sixth connecting pads.

3. The optical communication apparatus of claim 2, wherein the storage element, the calculation chip, and the control chip are respectively connected to the second connecting pads, the third connecting pads, and the sixth connecting pads via a eutectic manner.

4. The optical communication apparatus of claim 2, wherein the first plate portion comprises a plurality of fifth connecting pads on a surface facing toward the PCB, the second plate portion comprises a plurality of eighth connecting pads on a surface facing toward the PCB, the fifth connecting pads and the eighth connecting pads are corresponding to the first connecting pads, each of the fifth connecting pads and the eighth connecting pads is electrically connected to a corresponding first connecting pad.

5. The optical communication apparatus of claim 4, wherein the optical communication apparatus comprises a plurality of first soldering balls corresponding to the fifth connecting pads and a plurality of second soldering balls corresponding to the eighth connecting pads, the first soldering balls and the second soldering balls respectively connect the fifth connecting pads and the eighth connecting pads to the first connecting pads.

6. The optical communication apparatus of claim 2, wherein the photoelectric unit comprises a base plate, an emitter, a receiver, a first driver chip for driving the emitter, and a second driver chip for driving the receiver.

7. The optical communication apparatus of claim 6, wherein the base plate comprises a bottom layer and a conductive pattern formed on a surface of the bottom layer, and the emitter, the receiver, the first driver chip, and the second driver chip are connected to the base plate by the conductive pattern.

8. The optical communication apparatus of claim 7, wherein the emitter, the receiver, the first driver chip, and the second driver chip are connected to the conductive pattern via a eutectic manner.

9. The optical communication apparatus of claim 8, wherein the bottom layer defines a first through hole corresponding to the emitter and a second through hole corresponding to the receiver, the emitter is aligned with the light waveguide through the first through hole, and the receiver is aligned with the light waveguide through the second through hole.

10. The optical communication apparatus of claim 9, wherein the conductive pattern comprises a first conductive piece, a second conductive piece, a third conductive piece, and a fourth conductive piece, the first conductive piece and the second conductive piece are positioned at two opposite sides of the first through hole, and the third conductive piece and the fourth conductive piece are positioned at two opposite sides of the second through hole, the emitter is connected to the first conductive piece and the second conductive piece, and the receiver is connected to the third conductive piece and the fourth conductive piece.

11. The optical communication apparatus of claim 9, wherein the bottom layer defines a third through hole corresponding to the first driver chip and a fourth through hole corresponding to the second driver chip, the third through hole and the fourth through hole are respectively filled with a conductive material, the seventh connecting pad and the fourth connecting pad are respectively electrically connected to the first drive chip and the second driver chip by the conductive material.

* * * * *